US008471344B2

(12) United States Patent
Anderson et al.

(10) Patent No.: US 8,471,344 B2
(45) Date of Patent: Jun. 25, 2013

(54) INTEGRATED CIRCUIT DEVICE WITH SERIES-CONNECTED FIN-TYPE FIELD EFFECT TRANSISTORS AND INTEGRATED VOLTAGE EQUALIZATION AND METHOD OF FORMING THE DEVICE

(75) Inventors: Brent A. Anderson, Jericho, VT (US); Andres Bryant, Burlington, VT (US); Edward J. Nowak, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 818 days.

(21) Appl. No.: 12/563,194

(22) Filed: Sep. 21, 2009

(65) Prior Publication Data

US 2011/0068414 A1    Mar. 24, 2011

(51) Int. Cl.
*H01L 27/088* (2006.01)
*H01L 21/84* (2006.01)

(52) U.S. Cl.
USPC ........... 257/401; 257/241; 257/341; 257/365; 257/623; 257/E21.014; 257/E29.052; 438/157; 438/164; 438/176; 438/283

(58) Field of Classification Search
USPC .................. 257/241, 365–366, E21.014, 623, 257/341, 401, E29.052; 438/157, 176, 283, 438/164
See application file for complete search history.

(56) References Cited

U.S. PATENT DOCUMENTS

| | | | |
|---|---|---|---|
| 4,152,716 A | 5/1979 | Torii et al. | |
| 5,780,347 A | 7/1998 | Kapoor | |
| 5,834,807 A | 11/1998 | Kim | |
| 6,967,398 B2 | 11/2005 | Frech et al. | |
| 7,088,971 B2 | 8/2006 | Burgener et al. | |
| 7,177,619 B2 | 2/2007 | Nowak | |
| 7,248,120 B2 | 7/2007 | Burgener et al. | |
| 7,307,467 B2 | 12/2007 | Goodnow et al. | |
| 7,314,786 B1 | 1/2008 | Yang et al. | |
| 8,232,627 B2* | 7/2012 | Bryant et al. | 257/623 |
| 2002/0097598 A1 | 7/2002 | Hoenigschmid | |
| 2006/0214238 A1 | 9/2006 | Glass et al. | |
| 2006/0270367 A1 | 11/2006 | Burgener et al. | |
| 2006/0278927 A1 | 12/2006 | Park et al. | |
| 2007/0040221 A1 | 2/2007 | Gossner et al. | |

FOREIGN PATENT DOCUMENTS

JP    3226117 A    10/1991

OTHER PUBLICATIONS

Bryant et al., U.S. Appl. No. 12/563,195, Application Filed Sep. 21, 2009.

* cited by examiner

*Primary Examiner* — Jose R Diaz
(74) *Attorney, Agent, or Firm* — Gibb & Riley, LLC; Richard M. Kotulak, Esq.

(57) ABSTRACT

Disclosed is an integrated circuit device having stacked fin-type field effect transistors (FINFETs) with integrated voltage equalization and a method. A multi-layer fin includes a semiconductor layer, an insulator layer above the semiconductor layer and a high resistance conductor layer above the insulator layer. For each FINFET, a gate is positioned on the sidewalls and top surface of the fin and source/drain regions are within the semiconductor layer on both sides of the gate. Thus, the portion of the semiconductor layer between any two gates contains a source/drain region of one FINFET abutting a source/drain region of another. Conductive straps are positioned on opposing ends of the fin and also between adjacent gates in order to electrically connect the semiconductor layer to the conductor layer. Contacts electrically connect the conductive straps at the opposing ends of the fin to positive and negative supply voltages, respectively.

24 Claims, 6 Drawing Sheets

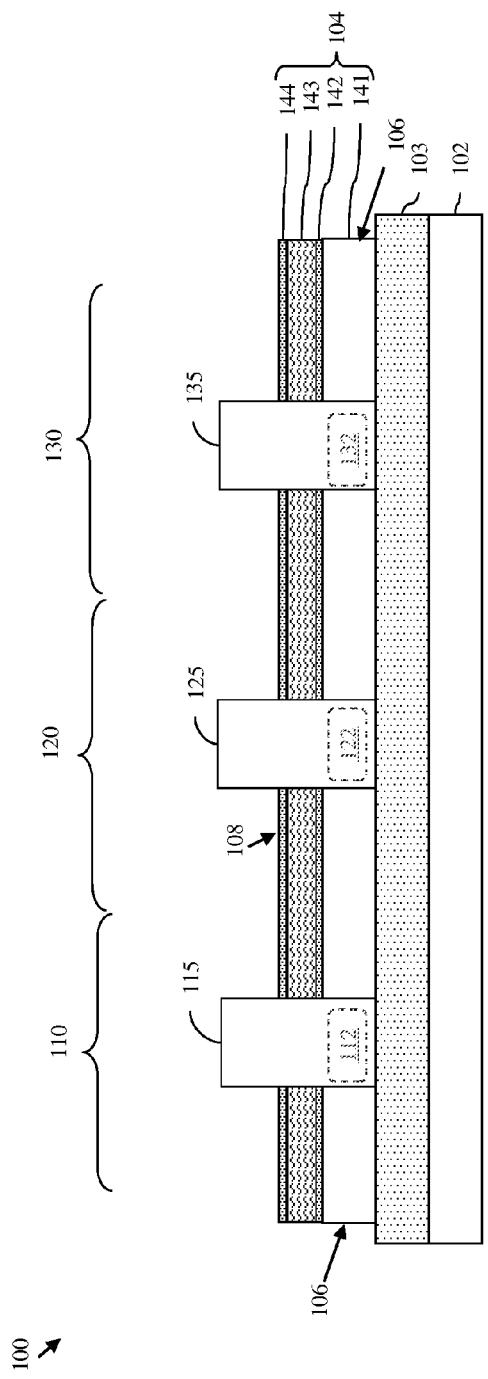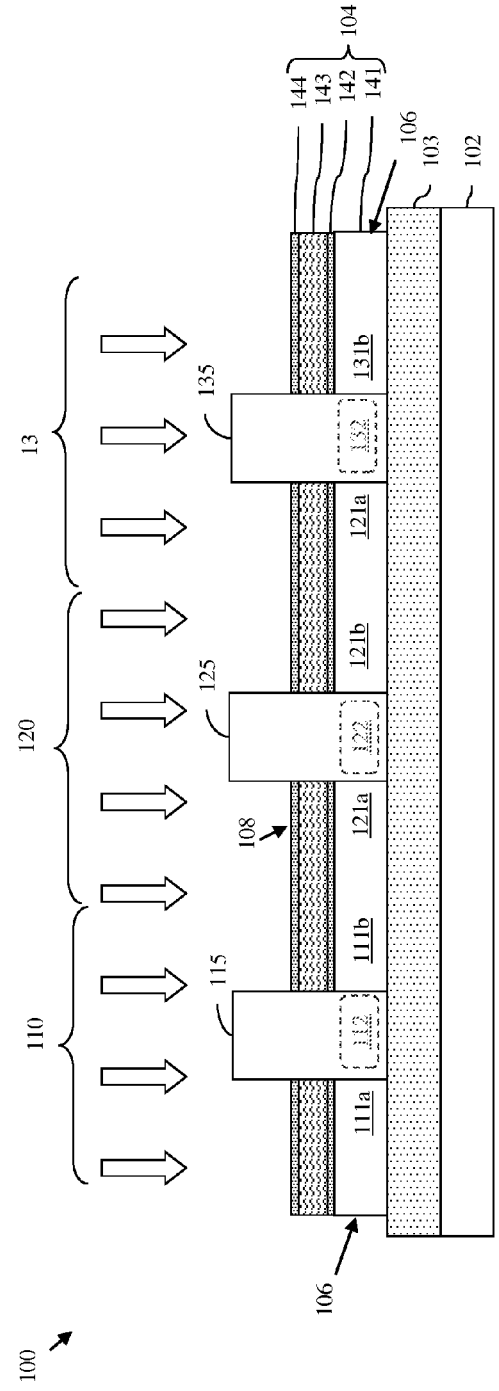

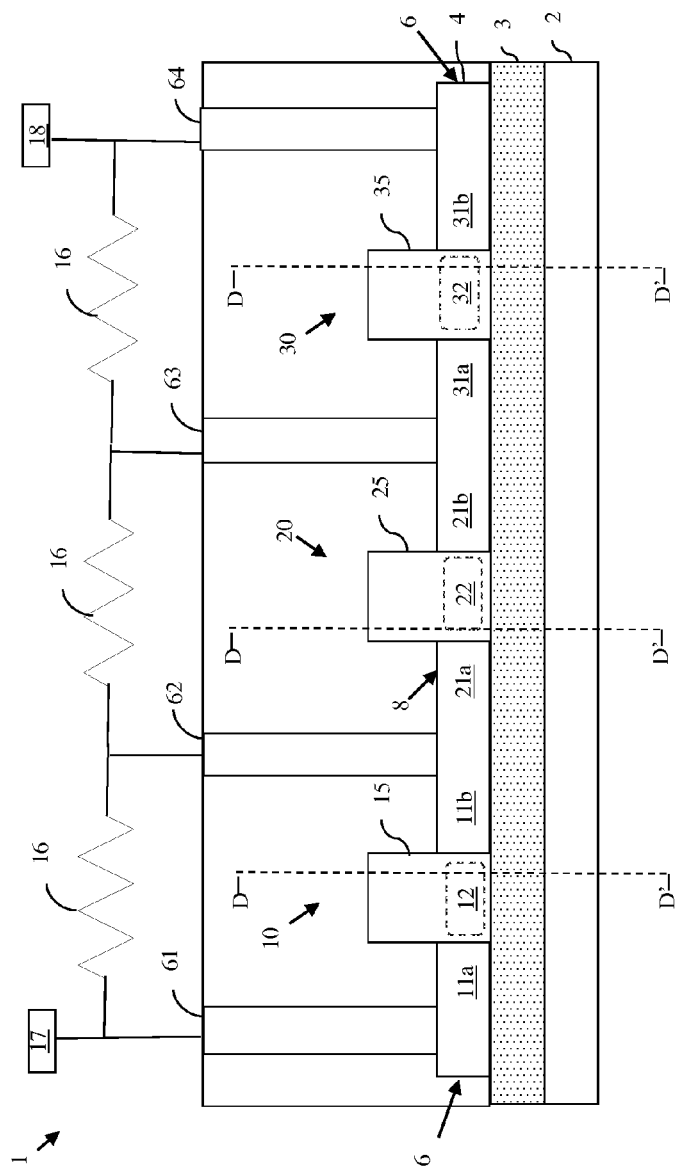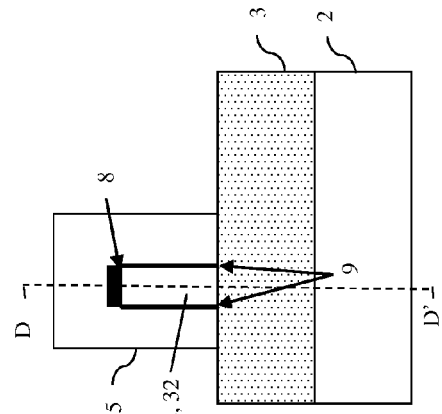
Figure 8A
Figure 8B

INTEGRATED CIRCUIT DEVICE WITH SERIES-CONNECTED FIN-TYPE FIELD EFFECT TRANSISTORS AND INTEGRATED VOLTAGE EQUALIZATION AND METHOD OF FORMING THE DEVICE

BACKGROUND

1. Field of the Invention

The embodiments of the invention generally relate to integrated circuit devices having series-connected field effect transistors (FETs) and, more specifically, to an integrated circuit device, such as a radio frequency (RF) switch, with series-connected fin-type field effect transistors (FINFETs) and integrated voltage equalization.

2. Description of the Related Art

Integrated circuit design decisions are often driven by device scalability and manufacturing efficiency.

For example, because size scaling of planar field effect transistors (FETs) resulted in reduced drive current as a function of reduced channel width, dual-gate FETs (also referred to herein as fin-type FETs or FINFETs) were developed to provide scaled devices with increased drive current and reduced short channel effects. Dual-gate FETs are non-planar FETs in which a fully depleted channel region is formed in the center of a relatively thin semiconductor fin with source and drain regions in the opposing ends of the fin adjacent to the channel region. A gate is formed over the top surface and on each side of the thin fin in an area corresponding to the channel region. A dielectric cap layer (such as a nitride cap layer) typically isolates the top surface of the channel region from the gate so that only two-dimensional field effects are exhibited. The effective channel width is determined by the fin height. Additionally, a fin thickness of approximately one-half (or less) the length of the gate can ensure suppression of deleterious short-channel effects, such as variability in threshold voltage and excessive drain leakage currents. The effective channel width of dual-gate FETs and, thereby, the device drive current can be increased by incorporating multiple semiconductor fins.

Additionally, because size scaling of field effect transistors (FETs), including dual-gate FETs, has resulted in limits on the maximum source-to-drain voltage that any single FET can reliably switch, FET networks with multiple series-connected FETs (i.e., stacked FETs) were developed in order to support the switching of higher source-to-drain voltages. In such FET networks, the series-connected FETs are also often connected in parallel to a discrete voltage distribution network in order to ensure uniform voltage distribution and, thereby to avoid breakdown run-away, when the FETs are in the off-state, and have a large voltage across the entire series network of FETs.

SUMMARY

Disclosed herein are embodiments of an integrated circuit structure, e.g., a radio frequency (RF) switch, having series-connected fin-type field effect transistors (FINFETs) with integrated voltage equalization rather than a discrete voltage distribution network. Specifically, a multi-layer fin is positioned above an isolation layer and includes a semiconductor layer, an insulator layer above the semiconductor layer and a high resistance conductor layer above the insulator layer. For each FINFET in the series, a gate is positioned adjacent to the opposing sidewalls and across the top surface of the fin, a channel region is within the semiconductor layer and defined by the gate and source/drain regions are within the semiconductor layer adjacent to both sides of the channel region. Thus, the portion of the semiconductor layer between any two adjacent gates will contain a source/drain region of one FINFET abutting a source/drain region of another. Conductive straps are positioned on the fin at the opposing ends and also between adjacent gates in order to electrically connect the semiconductor layer to the conductor layer. Finally, contacts electrically connect the conductive straps at the opposing ends of the fin to positive and negative supply voltages, respectively. The conductive straps in combination with the conductor layer integrated into the fin structure ensure uniform voltage distribution across the FINFETs in the series. Also, disclosed herein are embodiments of an associated method of forming such an integrated circuit structure.

More particularly, disclosed herein are embodiments of a device (e.g., a radio frequency (RF) switch). In these embodiments, the device can comprise a fin (i.e., a rectangular-shaped body having opposing ends, opposing sidewalls and a top surface) on an isolation layer. The fin can comprise a semiconductor layer on the isolation layer, a first insulator layer on the semiconductor layer, a high resistance conductor layer on the first insulator layer, and a second insulator layer on the conductor layer. Multiple gates can be positioned adjacent to the fin and can define channel regions in the semiconductor layer of the fin for multiple FINFETs connected in series (e.g., multiple n-type FINFETs connected in series). Source/drain regions can be located within the semiconductor layer on opposing sides of each of the channel regions such that each portion of the semiconductor layer between adjacent gates comprises a shared source/drain region (i.e., one source/drain region for one field effect transistor abutting another source/drain region for another field effect transistor). Conductive straps adjacent to the fin at the opposing ends and also between any adjacent gates can electrically connect the conductor layer to the source/drain regions and, more particularly, to the first and last source/drain regions at the opposing ends of the fin and to the shared source/drain regions between adjacent gates on the fin.

Also disclosed herein are embodiments of a method of forming a device, such as a radio frequency (RF) switch, having series-connected FINFETs with integrated voltage equalization. The method embodiments comprise forming a fin (i.e., a rectangular-shaped body having opposing ends, opposing sidewalls and a top surface) on an isolation layer. This fin can be formed such that it comprises a semiconductor layer on the isolation layer, a first insulator layer on the semiconductor layer, a high resistance conductor layer on the first insulator layer, and a second insulator layer on the conductor layer. Next, multiple gates can be formed adjacent to the fin in order to define channel regions in the semiconductor layer for multiple FINFETs connected in series (e.g., multiple n-type FINFETs connected in series). Then, source/drain regions can be formed within the semiconductor layer on opposing sides of each of the channel regions such that each portion of the semiconductor layer between adjacent gates comprises a shared source/drain region (i.e., one source/drain region for one field effect transistor abutting another source/drain region for another field effect transistor). Finally, conductive straps can be formed adjacent to the fin at the opposing ends and also between any adjacent gates in order to electrically connect the conductor layer to the source/drain regions and, more particularly, to the first and last source/drain regions at the opposing ends of the fin and to the shared source/drain regions between adjacent gates on the fin.

BRIEF DESCRIPTION OF THE SEVERAL VIEWS OF THE DRAWINGS

The embodiments of the invention will be better understood from the following detailed description with reference to the drawings, which are not necessarily drawing to scale and in which:

FIG. 5 is a schematic diagram illustrating a partially completed device formed according to the method of FIG. 2;

FIG. 6 is a schematic diagram illustrating a partially completed device formed according to the method of FIG. 2;

FIG. 8A is a schematic diagram illustrating an integrated circuit device 1 with series-connected fin-type field effect transistors and a discrete voltage distribution network; and FIG. 8B is a cross-section view D-D' of the device of FIG. 8A.

DETAILED DESCRIPTION

Figure 1:
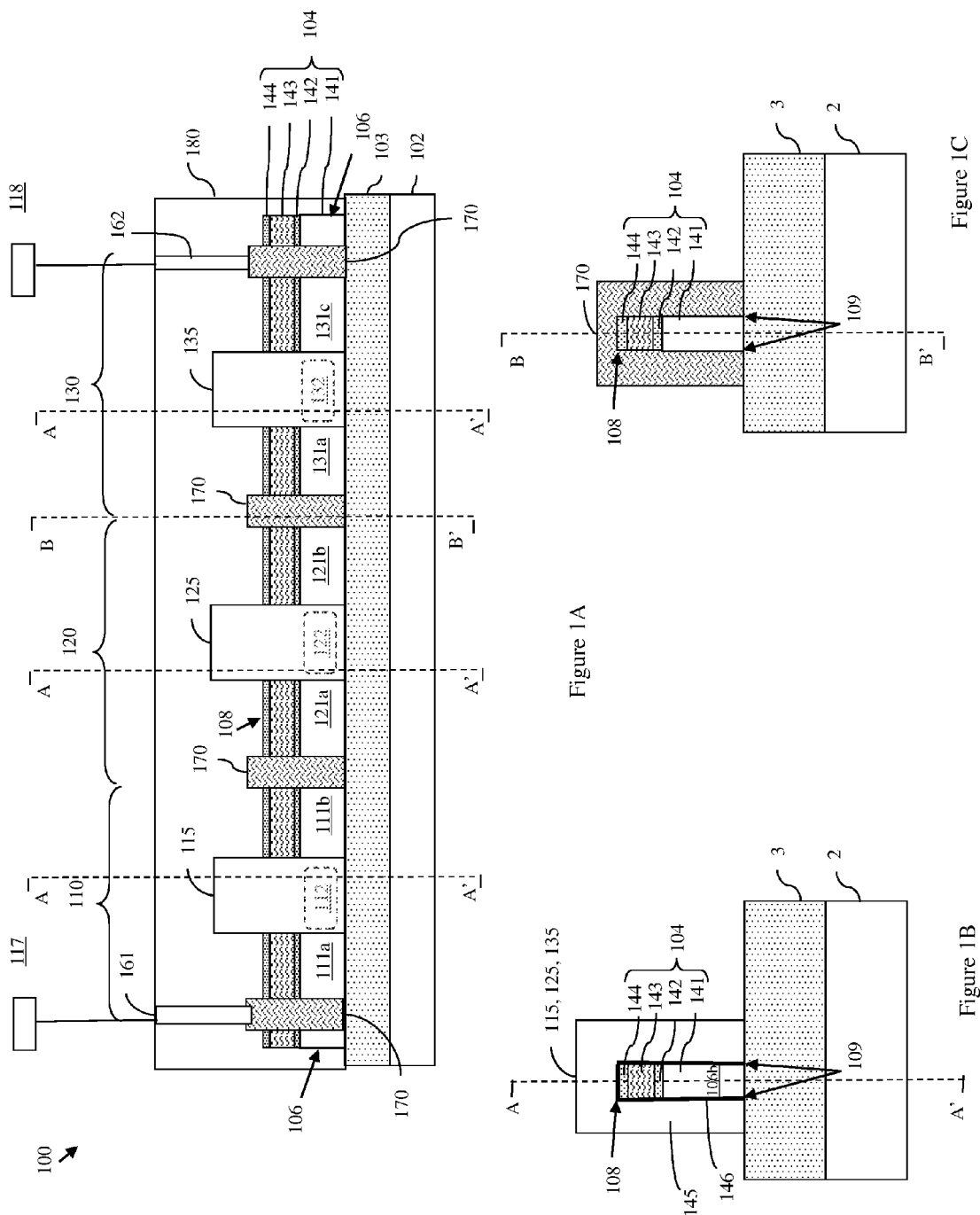
FIG. 1A is a schematic diagram illustrating an embodiment 100 of an integrated circuit device, such as a radio frequency (RF) switch, with series-connected fin-type field effect transistors and an integrated voltage distribution network.
FIG. 1B is a cross-section view A-A' of the device of FIG. 1A.
FIG. 1C is a different cross-section view B-B' of the device of FIG. 1A.

The embodiments of the invention and the various features and advantageous details thereof are explained more fully with reference to the non-limiting embodiments that are illustrated in the accompanying drawings and detailed in the following description.

As mentioned above, integrated circuit design decisions are often driven by device scalability and manufacturing efficiency.

For example, because size scaling of planar field effect transistors (FETs) resulted in reduced drive current as a function of reduced channel width, dual-gate FETs (also referred to herein as fin-type FETs or FINFETs) were developed to provide scaled devices with increased drive current and reduced short channel effects. Dual-gate FETs are non-planar FETs in which a fully depleted channel region is formed in the center of a relatively thin semiconductor fin with source and drain regions in the opposing ends of the fin adjacent to the channel region. A gate is formed over the top surface and on each side of the thin fin in an area corresponding to a designated channel region. A dielectric cap layer (such as a nitride cap layer) typically isolates the top surface of the channel region from the gate so that only two-dimensional field effects are exhibited. The effective channel width is determined by the fin height. Additionally, a fin thickness of approximately one-half (or less) the length of the gate can ensure suppression of deleterious short-channel effects, such as variability in threshold voltage and excessive drain leakage currents. The effective channel width of dual-gate FETs and, thereby, the device drive current can be increased by incorporating multiple semiconductor fins.

Additionally, because size scaling of field effect transistors (FETs), including dual-gate FETs, has resulted in limits on the maximum source-to-drain voltage that any single FET can reliably switch, FET networks with multiple series-connected FETs (i.e., stacked FETs) were developed in order to support the switching of higher source-to-drain voltages. In such FET networks, the series-connected FETs are also often connected in parallel to a discrete voltage distribution network in order to ensure uniform voltage distribution and, thereby to avoid breakdown run-away.

For example, FIG. 8A shows an integrated circuit device 1 having multiple series-connected non-planar (FETs) and, more particularly, multiple series-connected fin-type field effect transistors (FINFETs) 10, 20, 30 connected in parallel to a discrete voltage distribution network. Specifically, the device 1 comprises a semiconductor fin 4 (i.e., a relatively thin rectangular-shaped semiconductor body) positioned on an isolation layer 3 (e.g., a buried oxide (BOX) layer, doped semiconductor layer, or other suitable isolation layer) above a semiconductor substrate 2 (e.g., a silicon substrate). In each FINFET 10, 20, 30, a gate 15, 25, 35 is positioned on the opposing sidewalls 9 and across the top surface 8 of the semiconductor fin 4 in order to define a corresponding channel region 12, 22, 32 (e.g., see FIG. 8B). Additionally, within the semiconductor fin 4, each of the channel regions 12, 22, 32 are positioned between source/drain regions 11a-b, 21a-b, 31a-b, respectively. Thus, the portions of the semiconductor fin 4 between adjacent gates (e.g., between adjacent gates 15 and 25; between adjacent gates 25 and 35) are shared source/drain regions. That is, they contain a source/drain region of one FINFET abutting a source/drain region of another. The voltage distribution network is made up of multiple contacts 61-64 that drop to the opposing ends 6 of the semiconductor fin 4 and also to each of the shared source/drain regions (e.g., to shared source/drain regions 11b and 21a and to shared source/drain regions 21b and 31a). These contacts 61-64 are electrically connected by equalization resistors 16 comprising, for example, high resistance conductive wires in the first metallization layer (M1). The first and last of these contacts 61 and 64 are further connected to different supply voltages 17 and 18 (e.g., Vdd and Vss). Unfortunately, in this configuration, the discrete voltage distribution network and, particularly, the contacts 61-64, the wires connecting the contacts 61-64 to the equalization resistors 16 and the equalization resistors 16 themselves, add capacitive paths from the semiconductor fin 4 to the substrate 2, degrading isolation in the FET network and, thereby degrading performance.

In view of the foregoing, disclosed herein are embodiments of an integrated circuit device, such as a radio frequency (RF) switch, having series-connected fin-type field effect transistors (FINFETs) with integrated voltage equalization rather than a discrete voltage distribution network. Specifically, a multi-layer fin is positioned above an isolation layer and includes a semiconductor layer, an insulator layer above the semiconductor layer and a high resistance conductor layer above the insulator layer. For each FINFET in the series, a gate is positioned adjacent to the opposing sidewalls and across the top surface of the fin, a channel region is within the semiconductor layer and defined by the gate and source/drain regions are within the semiconductor layer on opposing sides of each channel region. Thus, the portion of the semiconductor layer between any two adjacent gates will contain a source/drain region of one FINFET abutting a source/drain region of another. Conductive straps are positioned on the fin at the opposing ends and also between adjacent gates in order to electrically connect the semiconductor layer to the conductor layer. Finally, contacts electrically connect the conductive straps at the opposing ends of the fin to positive and negative supply voltages, respectively. Also, disclosed herein are embodiments of an associated method of forming such an integrated circuit structure.

Referring to FIG. 1A, the device 100 can comprise two or more series-connected fin-type field effect transistors (FIN-FETs) (i.e., stacked FINFETs) with an integrated voltage distribution network. For example, in one embodiment, the device 100 can comprise a radio frequency (RF) switch comprising two or more series-connected n-type FINFETs with an integrated voltage distribution network.

For illustration purposes, the device 100 is shown in FIG. 1A as having three, series-connected, FINFETs 110, 120, 130. For each FINFET 110, 120, 130, a gate 115, 125, 135 is positioned on the opposing sidewalls 109 and across the top surface 108 of a multi-layer fin 104 in order to define a channel region 112, 122, 132 (see FIG. 1B). Additionally, within the multi-layer fin 104, each of the channel regions 112, 122, 132 are positioned between source/drain regions 111a-b, 121a-b, 131a-b, respectively. Thus, the portions of the multi-layer fin 104 between adjacent gates (e.g., between gates 115 and 125; between gates 125 and 135) are shared source/drain regions. That is, they contain a source/drain region of one FINFET abutting a source/drain region of another.

Specifically, the device 100 can comprise an isolation layer 103 (e.g., a buried oxide (BOX) layer, a doped semiconductor layer, or other suitable isolation layer) on a semiconductor substrate 102 (e.g., a silicon substrate). The device 100 can further comprise a multi-layer fin 104 (i.e., a multi-layer, relatively thin, rectangular-shaped body having opposing sidewalls 109, a top surface 108 and opposing ends 106) on the isolation layer 103. This multi-layer fin 104 can comprise a semiconductor layer 141 on the isolation layer 103, a first insulator layer 142 on the semiconductor layer 141, a high resistance conductor layer 143 on the first insulator layer 142, and a second insulator layer 144 on the conductor layer 143.

The semiconductor layer 141 can comprise a single crystalline semiconductor material. For example, the semiconductor layer 141 can comprise silicon (Si), silicon germanium (SiGe), or any other suitable single crystalline semiconductor material. The first insulator layer 142 can comprise a dielectric material. For example, the first insulator layer 142 can comprise silicon dioxide ($SiO_2$), silicon nitride (SiN), silicon oxynitride ($SiO_xN_y$) or other suitable dielectric material). The second insulator layer 144 can comprise either the same or a different dielectric material as that used in the first insulator layer 142. The high resistance conductor layer 143 can comprise a conductive material having a desired resistance. This conductive material can be pre-selected or processed during fin formation such that it will have a higher electrical resistance than the channel regions 112, 122, 132 of the series-connected FINFETs 110, 120, 130 when the FINFETs 110, 120, 130 are in the "on" state, but a lower electrical resistance than the channel regions 112, 122, 132 when the FINFETs 110, 120, 130 are in the "off" state. Those skilled in the art will recognize that the "on" state refers to a state when the gate voltage minus the source voltage is approximately one volt or more above the threshold voltage for the FINFETs 110, 120, 130 and that the "off" state refers to a state when the gate voltage is equal to the source voltage.

For example, in one embodiment, the conductor layer 143 can comprise a polysilicon material doped with an n-type or p-type dopant in order to achieve the desired resistance. For example, if the FINFETS 110, 120, 130 comprise n-type FETs with source and drain regions 111a-b, 121a-b, 131a-b that are heavily doped with an n-type conductivity dopant (e.g., a Group V dopant, such as arsenic (As), phosphorus (P) or antimony (Sb)), then the conductor layer 143 can comprise a polysilicon material that is doped with a lesser concentration of the same or a different n-type conductivity dopant. Conversely, if the FINFETs 110, 120, 130 comprise p-type FETs with source and drain regions 111a-b, 121a-b, 131a-b that are heavily doped with a p-type conductivity dopant (e.g., a Group III dopant, such as boron (B)), then the conductor layer 143 can comprise a polysilicon material that is doped with a lesser concentration of the same or a different p-type conductivity dopant. In alternative embodiments, the conductor layer 143 can comprise a metal material preselected for its resistance or a metal material infused with a species in order to achieve the desired resistance (e.g., as shown in U.S. Pat. No. 7,314,786 of Yang et al., issued on Jan. 1, 2008, assigned to International Business Machines Corporation, and incorporated herein by reference).

Multiple gates 115, 125, 135 can be positioned adjacent to the fin 104 such that they are each separated by a predetermined distance. These gates 115, 125, 135 can define channel regions 112, 122, 132 in the semiconductor layer 141. As shown in FIG. 1B, each gate 115, 125, 135 can comprise a gate dielectric layer 146 (e.g., a silicon oxide ($SiO_2$) layer or other suitable gate dielectric layer) on the opposing sides 109 of the fin 104 and a gate conductor layer 145 (e.g., a doped polysilicon layer or other suitable gate conductor layer) on the gate dielectric layer 146. Additionally, source/drain regions 111a-b, 121a-b, 131-b can be located within the semiconductor layer 141 on opposing sides of each of the channel regions 112, 122, 132. Thus, the portions of the semiconductor layer 141 between adjacent gates (e.g., between gates 115 and 125 or between gates 125 and 135) will each contain a source/drain region of one FINFET abutting a source/drain region of another. That is, they will comprise shared source/drain regions. Additionally, it should be noted that in the device 100, the gates 115, 125, 135 are electrically isolated from the conductor layer 143 of the fin 104 by the second insulator layer 144 at the top of the fin 104 and also by the gate dielectric layer 146 (see FIG. 1B).

Consequently, the device 100 comprises a first FINFET 110 connected in series to a second FINFET 120 which is optionally connected in series to a third FINFET 130 and so on. The first FINFET 110 can comprise a first gate 115 adjacent to the opposing sidewalls 109 and the top surface 108 of the fin 104, a first channel region 112 within the semiconductor layer 141 and defined by the first gate 115, and first source/drain regions 111a-b within the semiconductor layer 141 on opposing sides of the first channel region 112. The second FINFET 120 can comprise a second gate 125 adjacent to the opposing sidewalls 109 and the top surface 108 of the fin 104 and separated from the first gate 115 by a predetermined distance, a second channel region 122 within the semiconductor layer 141 and defined by the second gate 125, and second source/drain regions 121a-b within the semiconductor layer 141 on opposing sides of the second channel region 122. The third FINFET 130 can comprise a third gate 135 adjacent to the opposing sidewalls 109 and the top surface 108 of the fin 104 and separated from the second gate 125 by a predetermined distance, a third channel region 132 within the semiconductor layer 141 and defined by the third gate 135, and third source/drain regions 131a-b within the semiconductor layer 141 on opposing sides of the third channel region 132 and so on. Thus, the portion of the semiconductor layer 141 between the first gate 115 and the second gate 125 comprises a shared source/drain region 111b-121a (i.e., the source/drain region 111b of the first FINFET 110 abuts the source/drain region 121a of the second FINFET 120). Similarly, the portion of the semiconductor layer 141 between the second gate 125 and the third gate 135 comprises a shared source/drain region 121b-131a (i.e., the source/drain region 121b of the second FINFET 120 abuts the source/drain region 131a of the third FINFET 130).

Each of these FINFETs 110, 120, 130 can further comprise additional features, including but not limited to, gate sidewall spacers, halo regions, and source/drain extension regions. Inclusion of these features in FINFETs is well-known in the art and, thus, the details and illustrations of such features are omitted from this specification in order to allow the reader to focus on the salient aspects of the embodiments described herein.

The device 100 can further comprise conductive straps 170 on the multi-layer fin 104 at the opposing ends 106 and also positioned laterally approximately midway between all adjacent gates. These straps 170 can be configured such that they electrically connect the conductor layer 143 to the semiconductor layer 141 and, more particularly, such that they electrically connect the conductor layer 143 to the source/drain regions 111a-b, 121a-b, 131a-b. For example, conductive straps 170 at the ends 106 of the fin can electrically connect the first source/drain region 111a and the last source/drain region of the series-connected FINFETS 110, 120, 130 to the conductor layer 143. Additional conductive straps 170 can be positioned laterally approximately midway between the first gate 115 and the second gate 125 in order to electrically connect the shared source/drain region 111b-121a to the conductor layer 143, approximately midway between the second gate 125 and the third gate 135 in order to electrically connect the shared source/drain region 121b-131a to the conductor layer 143, and so on. Each conductive strap 170 can comprise, for example, a metal strap or, alternatively, a polysilicon strap doped with a same conductivity type dopant as the source/drain regions 111a-b, 121a-b, 131a-b of the FINFETs 110, 120, 130. Additionally, each conductive strap 170 must at least be positioned on one sidewall of the fin 104 such that it extends vertically from the bottom of the fin 104 to above the first insulator layer 142 and, thereby contacts both the semiconductor layer 141 and the conductor layer 143. In one embodiment, as illustrated in FIG. 1C, the conductive straps 170 each have vertical portions adjacent to the opposing sidewalls 109 of the fin 104 and a horizontal portion that traverses the top surface 108 of the fin 104.

Finally, the device 100 can comprise an interlayer dielectric layer 180 above the series-connected FINFETs 110, 120, 130 and contacts 161, 162 that extend through the interlayer dielectric layer 180 down to the conductive straps 170 on the opposing ends 106 of the fin 104. Such contacts 161, 162 can be used to electrically connect the conductive straps 170 at the opposing ends 106 only of the fin 104 to a first supply voltage 117 (e.g., a positive supply voltage Vdd) and a second supply voltage 118 different from said first supply voltage (e.g., a negative supply voltage Vss), respectively.

It should be noted that, while the device 100 is illustrated in FIGS. 1A-C as having a single multi-layer fin, it is anticipated that the device 100 could, alternatively, comprise multiple multi-layer fins over which the gates are formed in order to increase the effective channel width and, thereby the device drive current of each FINFET in the series. In this case, each fin would include a conductor layer and conductive straps, as described above. Additionally, contacts would drop to the ends of each fin with contacts at one end being electrically connected to the first supply voltage and with contacts at the opposite end being electrically connected to the second supply voltage.

Figure 2:
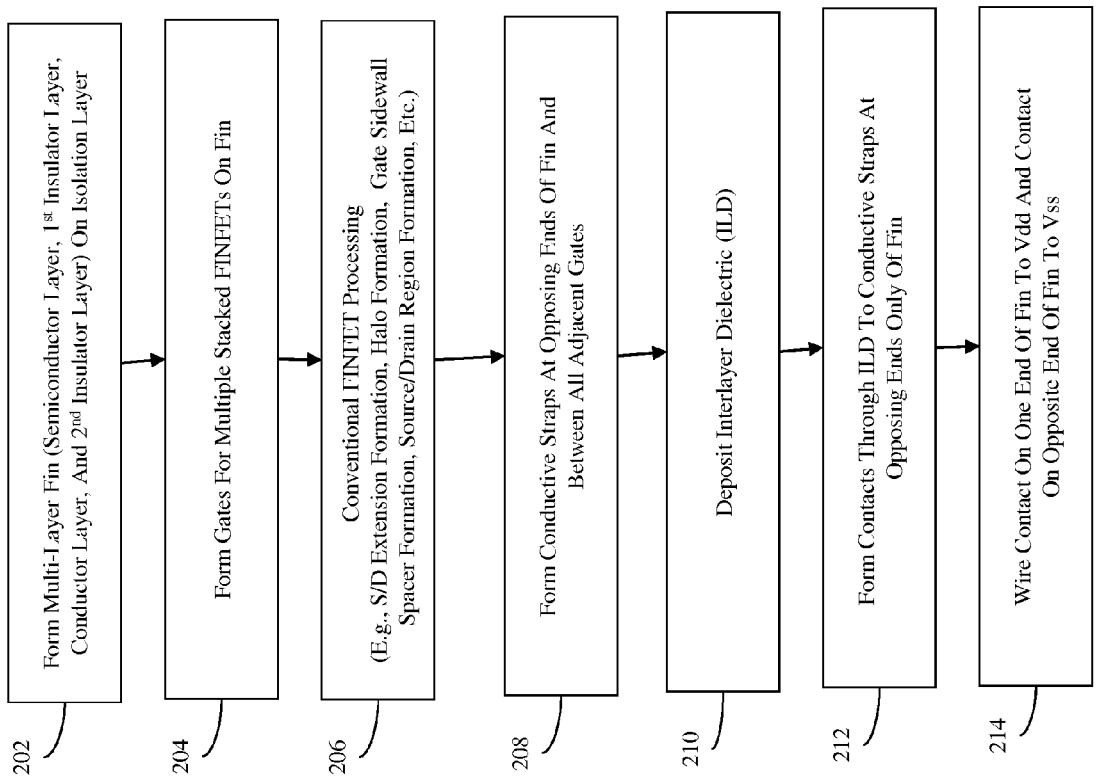
FIG. 2 is a flow diagram illustrating an embodiment of a method of forming the device of FIG. 1A.

Referring to FIG. 2, also disclosed herein are embodiments of an associated method of forming a device, such as an radio frequency (RF) switch, comprising two or more series-connected FINFETs 110, 120, 130 (e.g., two or more series-connected n-type FINFETs) with an integrated voltage distribution network, as shown in FIG. 1A.

Figure 3:
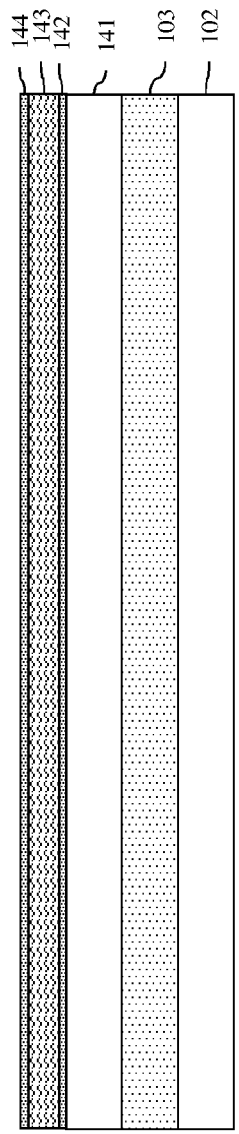
FIG. 3 is a schematic diagram illustrating a partially completed device formed according to the method of FIG. 2.

Specifically, the method embodiment can comprise forming a multi-layer fin 104 (i.e., a multi-layer, relatively thin, rectangular-shaped body having opposing sidewalls 109, a top surface 108 and opposing ends 106) on an isolation layer (202). This can be accomplished by providing a wafer, such as a silicon on insulator (SOI) wafer, comprising a semiconductor substrate 102 (e.g., a silicon substrate), an isolation layer 103 (e.g., a buried oxide (BOX) layer, a doped semiconductor layer, or other suitable isolation layer) on the substrate 102, and a semiconductor layer (e.g., a silicon (Si) layer, a silicon germanium (SiGe) layer, or any other suitable single crystalline semiconductor material layer) on the isolation layer 103 (see FIG. 3).

Next, a first insulator layer 142 can be formed (e.g., deposited) on the semiconductor layer 141. This first insulator layer 142 can be formed such that it comprises a dielectric material (e.g., silicon dioxide ($SiO_2$), silicon nitride (SiN), silicon oxynitride ($SiO_xN_y$) or other suitable dielectric material) (see FIG. 3).

After the first insulator layer 142 is formed on the semiconductor layer 141, a high resistance conductor layer 143 can be formed (e.g., deposited) on the first insulator layer 142. This conductor layer 143 can be formed such that it will have a higher electrical resistance than the channel regions 112, 122, 132 of the subsequently formed series-connected FINFETs 110, 120, 130 (as shown in FIG. 1A) when the FINFETs 110, 120, 130 are in the "on" state, but a lower electrical resistance than the channel regions 112, 122, 132 when the FINFETs 110, 120, 130 are in the "off" state. Those skilled in the art will recognize that the "on" state refers to a state when the gate voltage minus the source voltage is approximately one volt or more above the threshold voltage for the FINFETs 110, 120, 130 and that the "off" state refers to a state when the gate voltage is equal to the source voltage.

For example, in one embodiment, the conductor layer 143 can be formed by depositing polysilicon material and either in-situ doping or subsequently implanting the polysilicon material with a sufficient concentration of an n-type or p-type dopant in order to achieve the desired resistance. For example, if the FINFETS 110, 120, 130 comprise n-type FETs with source and drain regions 111a-b, 121a-b, 131a-b that are heavily doped with an n-type conductivity dopant (e.g., a Group V dopant, such as arsenic (As), phosphorus (P) or antimony (Sb)), then the conductor layer 143 can comprise a polysilicon material that is doped with a lesser concentration of the same or a different n-type conductivity dopant. Conversely, if the FINFETs 110, 120, 130 comprise p-type FETs with source and drain regions 111a-b, 121a-b, 131a-b that are heavily doped with a p-type conductivity dopant (e.g., a Group III dopant, such as boron (B)), then the conductor layer 143 can comprise a polysilicon material that is doped with a lesser concentration of the same or a different p-type conductivity dopant. In alternative embodiments, the conductor layer 143 can be formed by depositing a metal material that is either preselected for its resistance or subsequently infused with a species in order to achieve the desired resistance (e.g., as shown in U.S. Pat. No. 7,314,786 of Yang et al., issued on Jan. 1, 2008, assigned to International Business Machines Corporation, and incorporated herein by reference) (see FIG. 3).

Once the conductor layer 143 is formed, a second insulator layer 144 can be formed (e.g., deposited) on the conductor layer 143. This second insulator layer 144 can be formed such that it comprises either the same or a different dielectric material as that used in the first insulator layer 142 (see FIG. 3).

Figure 4A:
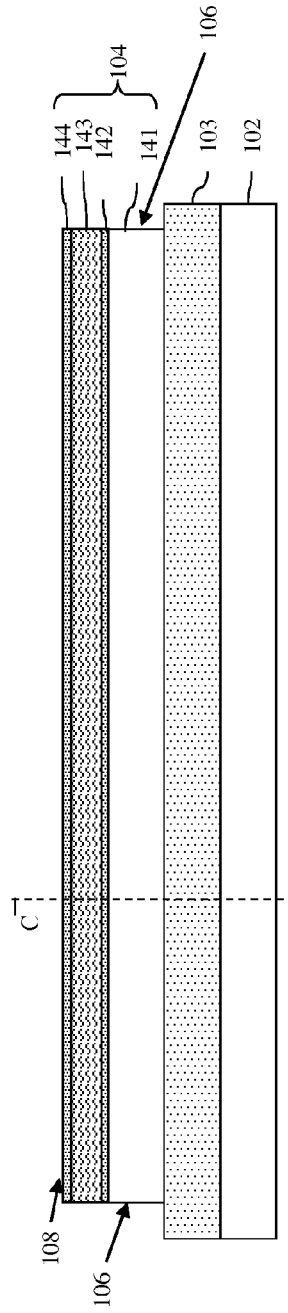
FIG. 4A is a schematic diagram illustrating a partially completed device formed according to the method of FIG. 2.
Figure 4B:
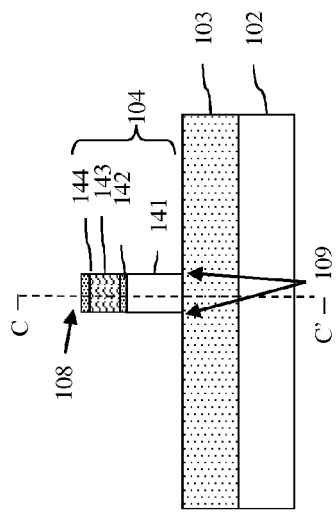
FIG. 4B is a cross-section view C-C' of the partially completed device of FIG. 4A.

Next, the wafer is patterned (e.g., using conventional photolithography techniques) and etched (e.g., using one or more anisotropic etch processes) in order to form a multi-layer fin 104 (i.e., a multi-layer rectangular-shaped body having opposing ends 106, opposing sidewalls 109 and a top surface 108) on the isolation layer 103 (204, see FIGS. 4A and 4B). Thus, the multi-layer fin 104 comprises a semiconductor layer 141 on the isolation layer 103, a first insulator layer 142 on the semiconductor layer 141, a conductor layer 143 on the first insulator layer 142, and a second insulator layer 144 on the conductor layer 143.

After the multi-layer fin 104 is formed, multiple gates 115, 125, 135, for the multiple stacked FINFETs 110, 120, 130, can be formed on the opposing sidewalls 109 and the top surface 108 of the fin 104 such that the gates 115, 125, 135 define channel regions 112, 122, 132 (204, see FIG. 5). Specifically, a first gate 115 defining a first channel region 112 for a first FINFET, a second gate 125 defining a second channel region 122 for a second FINFET, optionally a third gate 135 defining a third channel region 132 for a third FINFET and so on can each be formed on the opposing sides 109 and across the top surface 108 of the fin 104 such that each gate is separated from any adjacent gates by a predetermined distance. This can be accomplished, for example, by depositing a thin conformal gate dielectric layer (e.g., a silicon oxide ($SiO_2$) layer or other suitable gate dielectric layer) over the fin 104. Next, a blanket gate conductor layer (e.g., a doped polysilicon layer or other suitable gate conductor layer) can be deposited on the gate dielectric layer, thereby forming a gate stack. The gate stack, including the gate dielectric layer and gate conductor layer, can then be patterned (e.g., using conventional photolithography techniques) and etched (e.g., using one or more anisotropic etch processes) in order to form the discrete gates 115, 125, 135 (e.g., see FIG. 1B).

Once the gates 115, 125, 135 are formed, conventional FINFET processing can be performed (206). For example, source/drain regions 111a-b, 121a-b, 131a-b can be formed within the semiconductor layer 141 on opposing sides of the channel regions 112, 122, 132, respectively (see FIG. 6). Thus, the portions of the semiconductor layer 141 between adjacent gates (e.g., between gates 115 and 125 or between gates 125 and 135) will comprise shared source/drain regions (e.g., 111b-121a, 121b-131a). That is, they will each contain a source/drain region of one FINFET abutting a source/drain region of another. Source/drain formation can be accomplished, for example, by implanting a relatively high concentration of either an n-type dopant (e.g., a Group V dopant, such as arsenic (As), phosphorus (P) or antimony (Sb)) for n-type FINFETs or a p-type dopant (e.g., a Group III dopant, such as boron (B)) for p-type FINFETs into exposed portions of the semiconductor layer 141 adjacent to the channel regions 112, 122, 132. Additional FINFET processing can include, but is not limited, halo formation, gate sidewall spacer formation, source/drain extension formation, silicide formation, etc., the techniques for which are well-known in the art and, thus, omitted from this specification in order to allow the reader to focus on the salient aspects of the embodiments described herein.

Figure 7:
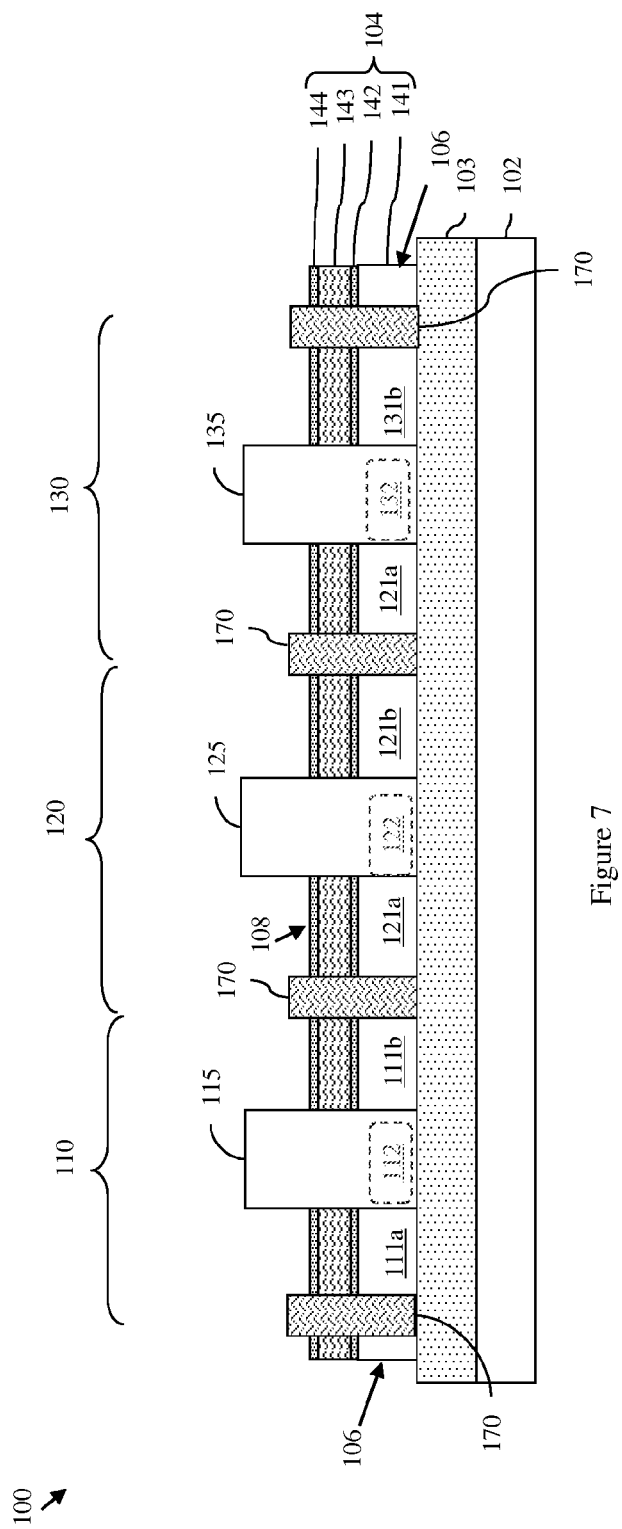
FIG. 7 is a schematic diagram illustrating a partially completed device formed according to the method of FIG. 2.

Next, conductive straps 170 can be formed on the fin 104 at the opposing ends 106 and also positioned laterally approximately midway between any adjacent gates (e.g, between the first gate 115 and the second gate 125, between the second gate 125 and the third gate 135 and so on) (208, see FIG. 7). These conductive straps 170 can be formed such that they electrically connect the conductor layer 143 to the source/drain regions 111a-b, 121a-b, 131a-b in the semiconductor layer 141. For example, conductive straps 170 can be formed at the ends of the fin 104 to electrically connect the first source/drain region 111a and the last source/drain region of the series-connected FINFETS 110, 120, 130 to the conductor layer 143. Additionally, a conductive strap 170 can be formed approximately midway between the first gate 115 and the second gate 125 to electrically connect the shared source/drain region 111b-121a to the conductor layer 143 and another conductive strap 170 can be formed approximately midway between the second gate 125 and the third gate 135 to electrically connect the shared source/drain region 121b-131a to the conductor layer 143 and so on. The conductive straps 170 can be formed, for example, by depositing a layer of metal or polysilicon, which is then patterned (e.g., using conventional photolithography techniques) and etched (e.g., using one or more anisotropic etch processes) so as to form discrete conductive straps 170 (i.e., either polysilicon or metal straps) each having vertical portions adjacent to the opposing sidewalls 109 of the fin 104 and a horizontal portion that traverses the top surface 108 of the fin 104 (see FIG. 1C). It should be noted that if a polysilicon layer is used at process 208 to form the conductive straps 170, the polysilicon layer should be either in-situ doped or subsequently implanted with a dopant having the same conductivity type as the source/drain regions 111a, 111b, 111c (e.g., an n-type dopant in the case of n-type FINFETs).

After the conductive straps 170 are formed, an interlayer dielectric 180 may be deposited and planarized (210). Then, contacts 161-162 can be formed (e.g., using conventional damascene or dual-damascene techniques) through the interlayer dielectric 180 to the conductive straps 170 at the opposing ends 106 only of the fin 104 and these contacts can be wired to (i.e., electrically connected) to a first supply voltage 117 (e.g., a positive supply voltage Vdd) and a second supply voltage 118 different from the first supply voltage (e.g., a negative supply voltage Vss), respectively (212-214, see FIG. 1A).

It should be understood that the corresponding structures, materials, acts, and equivalents of all means or step plus function elements in the claims below are intended to include any structure, material, or act for performing the function in combination with other claimed elements as specifically claimed. Additionally, it should be understood that the above-description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention.

Finally, it should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

Therefore, disclosed above are embodiments of an integrated circuit device, e.g., a radio frequency (RF) switch, having series-connected fin-type field effect transistors (FINFETs) with integrated voltage equalization rather than a discrete voltage distribution network. Specifically, a multi-layer fin is positioned above an isolation layer and includes a semiconductor layer, an insulator layer above the semiconductor layer and a high resistance conductor layer above the insulator layer. For each FINFET in the series, a gate is positioned adjacent to the opposing sidewalls and across the top surface of the fin, a channel region is within the semiconductor layer and defined by the gate and source/drain regions are within the semiconductor layer on opposing sides of the channel region. Thus, the portion of the semiconductor layer between any two adjacent gates will contain a source/drain region of one FINFET abutting a source/drain region of another. Conductive straps are positioned on the fin at the opposing ends and also between adjacent gates in order to electrically connect the semiconductor layer to the conductor layer. Finally, contacts electrically connect the conductive straps at the opposing ends of the fin to positive and negative supply voltages, respectively. This structure provides lower fin extrinsic resistance and further provides for voltage equalization while introducing only a minimal amount of capacitance between adjacent source/drain regions. Thus, a superior resistance on (Ron) versus impedance off (Zoff) is provided. Furthermore, in the case of radio frequency (RF) switches, the embodiments allow for increased off-state isolation and this increased off-state isolation allows for smaller chips sizes, lower power of operation, and lower cost. The embodiments also enable effectively wider FETs (e.g., FETs with taller fins and/or more fins in parallel) to be formed without increasing off-state isolation, resulting in lower on-state resistance and, thereby, lower insertion loss of the RF switch. Also, disclosed herein are embodiments of an associated method of forming such an integrated circuit structure.

What is claimed is:

1. A device comprising:
   an isolation layer;
   a fin having opposing ends, opposing sidewalls and a top surface, said fin comprising:
      a semiconductor layer on said isolation layer;
      a first insulator layer on said semiconductor layer; and
      a conductor layer on said first insulator layer;
   multiple gates adjacent to said fin and defining channel regions in said semiconductor layer of said fin for multiple fin-type field effect transistors connected in series;
   source/drain regions within said semiconductor layer on opposing sides of each of said channel regions such that each portion of said semiconductor layer between adjacent gates comprises one source/drain region for one field effect transistor abutting another source/drain region for another field effect transistor; and
   conductive straps adjacent to said fin at said opposing ends and between adjacent gates, said conductive straps electrically connecting said conductor layer to said source/drain regions.

2. The device of claim 1, said conductor layer comprising a conductive material having a higher resistance than said channel regions when said fin-type field effect transistors are in an "on" state and a lower resistance than said channel regions when said fin-type field effect transistors are in an "off" state.

3. The device of claim 1, said conductor layer comprising any one of a polysilicon layer doped with a same type dopant as said source/drain regions and a metal layer.

4. The device of claim 1, said conductive straps comprising any one of polysilicon straps doped with a same type dopant as said source/drain regions and metal straps.

5. The device of claim 1,
   said fin further comprising a second insulator layer on said conductor layer, and
   said first insulator layer and said second insulator layer comprising any one of an oxide material, a nitride material and an oxynitride material.

6. The device of claim 1, further comprising contacts electrically connecting said conductive straps at said opposing ends to a positive supply voltage and a negative supply voltage, respectively.

7. A radio frequency (RF) switch comprising:
   an isolation layer;
   a fin having opposing ends, opposing sidewalls and a top surface, said fin comprising:
      a semiconductor layer on said isolation layer;
      a first insulator layer on said semiconductor layer; and
      a conductor layer on said first insulator layer;
   multiple gates adjacent to said fin and defining channel regions in said semiconductor layer of said fin for multiple n-type fin-type field effect transistors connected in series;
   source/drain regions within said semiconductor layer on opposing sides of each of said channel regions such that each portion of said semiconductor layer between adjacent gates comprises one source/drain region for one field effect transistor abutting another source/drain region for another field effect transistor; and
   conductive straps adjacent to said fin at said opposing ends and between adjacent gates, said conductive straps electrically connecting said conductor layer to said source/drain regions.

8. The switch of claim 7, said conductor layer comprising a conductive material having a higher resistance than said channel regions when said fin-type field effect transistors are in an "on" state and a lower resistance than said channel regions when said fin-type field effect transistors are in an "off" state.

9. The switch of claim 7, said conductor layer comprising any one of a polysilicon layer doped with an n-type dopant and a metal layer.

10. The switch of claim 7, said conductive straps comprising any one of polysilicon straps doped with an n-type dopant and metal straps.

11. The switch of claim 7, said fin further comprising a second insulator layer on said conductor layer, and
   said first insulator layer and said second insulator layer comprising any one of an oxide material, a nitride material and an oxynitride material.

12. The switch of claim 7, further comprising contacts electrically connecting said conductive straps at said opposing ends to a positive supply voltage and a negative supply voltage, respectively.

13. A method of forming an integrated circuit structure, said method comprising:
   forming a fin on an isolation layer, said fin having opposing ends, opposing sidewalls, and a top surface and comprising:

a semiconductor layer on said isolation layer;
a first insulator layer on said semiconductor layer;
a conductor layer on said first insulator layer; and
a second insulator layer on said conductor layer;

forming multiple gates adjacent to said fin in order to define channel regions in said semiconductor layer for multiple fin-type field effect transistors connected in series;

forming source/drain regions within said semiconductor layer on opposing sides of each of said channel regions such that each portion of said semiconductor layer between adjacent gates comprises one source/drain region for one field effect transistor abutting another source/drain region for another field effect transistor; and forming conductive straps adjacent to said fin at said opposing ends and between adjacent gates such that said conductive straps electrically connect said conductor layer to said source/drain regions.

14. The method of claim 13, said forming of said fin comprising forming said fin such that said conductor layer comprises a conductive material that will have a higher resistance than said channel regions when said fin-type field effect transistors are in an "on" state and a lower resistance than said channel regions when said fin-type field effect transistors are in an "off" state.

15. The method of claim 13, said forming of said fin comprising forming said fin such that said conductor layer comprises any one of a polysilicon layer doped with a same conductivity type dopant as said source/drain region and a metal layer.

16. The method of claim 13, said forming of said fin comprising forming said fin such that said conductive straps comprise any one of polysilicon straps doped with a same conductivity type dopant as said source/drain regions and metal straps.

17. The method of claim 13, said forming of said fin comprising forming said fin such that said first insulator layer and said second insulator layer each comprise any one of an oxide material, a nitride material and an oxynitride material.

18. The method of claim 13, further comprising:
forming contacts to said conductive straps at said opposing ends; and
electrically connecting said contacts to a positive supply voltage and a negative supply voltage, respectively.

19. A method of forming a radio frequency (RF) switch, said method comprising:

forming a fin on an isolation layer, said fin having opposing ends, opposing sidewalls, and a top surface and comprising:
a semiconductor layer on said isolation layer;
a first insulator layer on said semiconductor layer;
a conductor layer on said first insulator layer; and
a second insulator layer on said conductor layer;

forming multiple gates adjacent to said fin in order to define channel regions in said semiconductor layer for multiple n-type fin-type field effect transistors connected in series;

forming source/drain regions within said semiconductor layer on opposing sides of each of said channel regions such that each portion of said semiconductor layer between adjacent gates comprises one source/drain region for one field effect transistor abutting another source/drain region for another field effect transistor; and forming conductive straps adjacent to said fin at said opposing ends and between adjacent gates such that said conductive straps electrically connect said conductor layer to said source/drain regions.

20. The method of claim 19, said forming of said fin comprising forming said fin such that said conductor layer comprises a conductive material that will have a higher resistance than said channel regions when said fin-type field effect transistors are in an "on" state and a lower resistance than said channel regions when said fin-type field effect transistors are in an "off" state.

21. The method of claim 19, said forming of said fin comprising forming said fin such that said conductor layer comprises any one of a polysilicon layer doped with an n-type dopant and a metal layer.

22. The method of claim 19, said forming of said fin comprising forming said fin such that said conductive straps comprise any one of polysilicon straps doped with an n-type dopant and metal straps.

23. The method of claim 19, said forming of said fin comprising forming said fin such that said first insulator layer and said second insulator layer each comprise any one of an oxide material, a nitride material and an oxynitride material.

24. The method of claim 19, further comprising:
forming contacts to said conductive straps at said opposing ends; and
electrically connecting said contacts to a positive supply voltage and a negative supply voltage, respectively.

* * * * *